United States Patent
Shiratake et al.

[11] Patent Number: 6,163,062
[45] Date of Patent: Dec. 19, 2000

[54] SEMICONDUCTOR DEVICE HAVING A METALLIC FUSE MEMBER AND CUTTING METHOD THEREOF WITH LASER LIGHT

[75] Inventors: Shigeru Shiratake; Hideki Genjo; Yasuhiro Ido; Atsushi Hachisuka; Koji Taniguchi, all of Tokyo, Japan

[73] Assignee: Mitsubishi Denki Kabushiki Kaisha, Tokyo, Japan

[21] Appl. No.: 09/071,158

[22] Filed: May 4, 1998

[30] Foreign Application Priority Data

Oct. 27, 1997 [JP] Japan .................................. P09-294105

[51] Int. Cl.7 ..................................................... H01L 29/00
[52] U.S. Cl. ........................... 257/529; 257/530; 257/209; 438/281
[58] Field of Search ..................................... 257/529, 530, 257/209; 438/281, 601

[56] References Cited

U.S. PATENT DOCUMENTS

| | | | |
|---|---|---|---|
| 5,374,590 | 12/1994 | Batdorf et al. | 438/601 |
| 5,444,012 | 8/1995 | Yoshizumi et al. | 438/6 |
| 5,608,257 | 3/1997 | Lee et al. | 257/529 |
| 5,760,674 | 6/1998 | Gilmour et al. | 257/529 |
| 5,851,903 | 12/1998 | Stamper | 438/467 |
| 5,872,389 | 2/1999 | Nishimura et al. | 257/529 |
| 5,879,966 | 3/1999 | Lee et al. | 438/132 |

FOREIGN PATENT DOCUMENTS

| | | |
|---|---|---|
| 58-92252 | 6/1983 | Japan . |
| 6-314535 | 11/1994 | Japan . |
| 8-213465 | 8/1996 | Japan . |

*Primary Examiner*—Olik Chaudhuri
*Assistant Examiner*—Phat X. Cao
*Attorney, Agent, or Firm*—Oblon, Spivak, McClelland, Maier & Neustadt, P.C.

[57] ABSTRACT

A semiconductor device has a plurality of fuse members ($1a$, $1b$) composed of a metal that can be cut by laser light (4), disposed over a semiconductor substrate (5). The length L of the fuse members ($1a$, $1b$) is smaller than a value obtained by subtracting an alignment error $\alpha$ of the laser light (4) from a spot diameter D of the laser light (4), i.e., the value (D−$\alpha$). The fuse members ($1a$, $1b$) are spaced a distance l larger than a value obtained by adding the alignment error $\alpha$ to the half of the spot diameter D, i.e., the value (D/2+$\alpha$).

8 Claims, 4 Drawing Sheets

SEMICONDUCTOR DEVICE HAVING A METALLIC FUSE MEMBER AND CUTTING METHOD THEREOF WITH LASER LIGHT

BACKGROUND OF THE INVENTION

1. Field of the Invention

The present invention relates to a semiconductor device and its manufacturing method and, in particular, to a semiconductor device having a metallic fuse member that can be cut by laser light and the manufacturing method thereof.

2. Description of the Background Art

Conventionally, fuses for use in redundant circuit replacement have been formed by a wiring layer comprising a polysilicon or a silicide underlying a metal wiring layer.

The technology of multi-layer wiring structure has advanced as well as the large scale integration of memories. Specifically, 1Mega-bit Dynamic Random Access Memory (hereinafter referred to as "1MDRAM") comprises three polysilicon wiring layers and a single Al wiring layer, 4MDRAM and 16MDRAM comprise four polysilicon wiring layers and two aluminum wiring layers, and the generations from 64MDRAM may have five polysilicon wiring layers and three aluminum wiring layers.

In conventional wiring layers comprising polysilicon or silicide that have been used as a fuse for a redundant circuit replacement, as the number of wiring layers is increased, the entire thickness of insulating films overlying the respective wiring layers is increased. This makes it difficult to carry out a stable blow of laser light, causing the difficulty in serving as a fuse.

More specifically, due to the presence of the aforesaid thick insulating film, laser light blow requires a large amount of laser light energy, which then damages an insulating film underlying a fuse, or a silicon substrate thereunder, and therefore causes an electrical leakage between the fuse and the substrate. This results in the malfunction of a redundant circuit.

To solve the above problem, there is a well-known technique in which a thick portion of insulating film is provided directly under a fuse. With this technique, the volume of this thick portion is relatively greater than that of other portions. Thus, even if a relatively large laser light is irradiated, the above stated problem does not occur.

In this technique, however, another processing step for forming a thick portion of insulating film is required and the irradiation energy of laser light cannot be reduced.

Japanese Patent Laid Open Gazette 8-213465 discloses a technique for obtaining semiconductor devices having a fuse member that can be cut by laser light of a relatively small energy, without additional processing steps.

FIGS. 6A and 6B are a diagram for explaining a semiconductor device described in the aforesaid publication; FIG. 6A is a plan view of a detailed part of the semiconductor device; and FIG. 6B is a cross-sectional view along line B—B of FIG. 6A.

Referring to FIGS. 6A and 6B, a fuse member 71 comprises a metal that can be cut by laser light, e.g., aluminum. Contact holes 72a, 72b make an electrical connection between the ends of the fuse member 71 and the underlying wiring layers 73a, 73b, respectively. An insulating film 74 is formed so as to envelop the fuse member 71 and the wiring layers 73a, 73b. Laser light 75 with an irradiation spot diameter D1 is irradiated to the fuse member 71. Here, the length L1 of the fuse member 71 is set so as to satisfy the condition $L1 \leq D1$.

In conventional semiconductor devices with the above construction, it is able to cut the fuse member 71 by the laser light 75 of a relatively small energy, without adding a special processing step.

However, these semiconductor devices have the problem that when a metal wiring layer is used as a fuse member, part of the fuse member, i.e., part of the metal, remains even after laser blow, and in a moisture proof test the remaining metal is corroded to affect the adjacent fuse, causing the malfunction of a redundant circuit.

To avoid such a corrosion, it has been proposed to cover with a silicon nitride film or the like after blowing a fuse member. However, this method is accompanied by an increase in the number of processing steps.

SUMMARY OF THE INVENTION

According to a first aspect of the present invention, a semiconductor device comprises: a semiconductor substrate; and at least one fuse member that can be cut by laser light, disposed over the semiconductor substrate, and is characterized by having a relation $L \leq D - \alpha$ where L is a length of the fuse member, D is a spot diameter of the laser light, and $\alpha$ is an alignment error of the laser light.

According to a second aspect of the present invention, the semiconductor device of the first aspect further comprises a pair of non-metallic conductive members disposed over the semiconductor substrate, and is characterized in that the fuse member is formed by a metal over the non-metallic conductive members and has a pair of ends electrically connected to the non-metallic conductive members through a contact hole, respectively.

According to a third aspect of the present invention, the semiconductor device of the second aspect further comprises first to Nth ($N \geq 2$) metal wiring layers stacked upward in sequence over the semiconductor substrate, and is characterized in that: the metal wiring layers are all disposed over the non-metallic conductive members; an insulating layer is disposed over the Nth metal wiring layer; the fuse member is formed by an (N-1)th metal wiring layer; an opening having a diameter S is present in the insulating layer directly above the fuse member; and a relation $S \geq D + \alpha$ is satisfied.

According to a fourth aspect of the present invention, the semiconductor device of the third aspect satisfies a relation $S > 2D$.

According to a fifth aspect of the present invention, the semiconductor device of the third aspect is characterized in that N is 2.

According to a sixth aspect of the present invention, the semiconductor device of the third aspect is characterized in that $N \geq 3$.

According to a seventh aspect of the present invention, the semiconductor device of the sixth aspect is characterized in that the (N-1)th metal wiring layer form a stacked-via type structure with an (N-2)th metal wiring layer.

According to an eighth aspect of the present invention, the semiconductor device of the second aspect further comprises first to Nth ($N \geq 3$) metal wiring layers stacked upward in sequence over the semiconductor substrate through a plurality of interlayer insulation films, respectively, and is characterized in that: the metal wiring layers are all disposed over the pair of non-metallic conductive members; the fuse member is formed by an (N-2)th metal wiring layer; an opening having a diameter M is present in one of the interlayer insulation layers between an Nth metal wiring layer and an (N-1)th metal wiring layer, directly above the fuse member; and a relation $M \geq 2D$ is satisfied.

According to a ninth aspect of the present invention, the semiconductor device of the eighth aspect is characterized in that: an insulating layer is disposed over the Nth metal wiring layer; an opening having a diameter S is present in the insulating layer directly above the fuse member; and a relation $S \geq M$ is satisfied.

According to a tenth aspect of the present invention, the semiconductor device of the first aspect is characterized in that: the fuse member is in plural and a pair of the fuse members adjacent with each other are spaced apart by a distance l; and a relation $(D/2)+\alpha \leq l$ is satisfied.

According to an eleventh aspect of the present invention, a method of manufacturing a semiconductor device comprises the steps of: (a) forming a plurality of pairs of non-metallic conductive members over a semiconductor substrate; (b) forming a plurality of fuse members for connecting the non-metallic conductive members per pair, the fuse members comprising a metal that can be cut by laser light; and (c) removing completely at least one of the fuse members by the laser light.

According to a twelfth aspect of the present invention, the method of the eleventh aspect is characterized in that: each of the fuse members has a contact part to be connected to the non-metallic conductive members and a metal wiring layer father away from the semiconductor substrate than the non-metallic conductive members; and the metal wiring layer and the contact part are removed in the step (c).

According to a thirteenth aspect of the present invention, the method of the twelfth aspect is characterized in that: the step (b) includes the step (b-1) of stacking upward first to Nth ($N \geq 2$) metal wiring layers in sequence over the semiconductor substrate through a plurality of interlayer insulation films, respectively, the metal wiring layers being all disposed over the non-metallic conductive members, the fuse members being formed by an (N–1th) metal wiring layer; and there are the steps, between the steps (b) and (c), comprising: (d) disposing an insulating layer over the Nth metal wiring layer; and (e) forming an opening having a diameter S in the insulating layer directly above the fuse members, wherein a relation $S \geq D+\alpha$ is satisfied.

According to a fourteenth aspect of the present invention, the method of the thirteenth aspect satisfies a relation $S>2D$.

According to a fifteenth aspect of the present invention, the method of the thirteenth aspect is characterized in that N is 2.

According to a sixteenth aspect of the present invention, the method of the thirteenth aspect is characterized in that $N \geq 3$ and the (N–1)th metal wiring layer form a stacked-via structure with an (N–2)th metal wiring layer.

According to a seventh aspect of the present invention, the method of the eleventh aspect is characterized in that in the step (b) the fuse members are all formed so as to have a length L not exceeding a value obtained by subtracting an alignment error a from a spot diameter D of the laser light.

According to an eighteenth aspect of the present invention, the method of the eleventh aspect is characterized in that: the step (b) includes the step (b-1) of stacking upward first to Nth ($N \geq 3$) metal wiring layers in sequence over the semiconductor substrate through a plurality of interlayer insulation films, respectively, the metal wiring layers being all disposed over the non-metallic conductive members, the fuse members being formed by an (N–2)th metal wiring layer; and there is the step (d), between the steps (b) and (c), of forming an opening having a diameter M in one of the interlayer insulation films between an Nth metal wiring layer and an (N–1)th metal wiring layer directly above the fuse members, wherein a relation $M \geq 2D$ is satisfied.

According to a nineteenth aspect of the present invention, the method of the eighteenth aspect further comprises the steps, between the steps (b) and (d), comprising: (e) forming an insulating layer over the Nth metal wiring layer; and (f) forming an opening having a diameter S in the insulating layer directly above the fuse members, wherein a relation $S \geq M$ is satisfied.

According to a twentieth aspect of the present invention, the method of the eleventh aspect is characterized in that the fuse members adjacent to each other are spaced apart by a distance l, satisfying a relation $(D/2)+\alpha \leq l$ where D is a spot diameter of the laser light and a is an alignment error of the laser light.

Thus, in accordance with the present invention, it is able to obtain semiconductor devices with a fuse that can be cut by a relatively small energy without adding a special processing step and also prevents corrosion, resulting in high reliability.

It is an object of the present invention to provide a semiconductor device with a fuse that can be cut by a relatively small energy without adding a special processing step and can also prevent corrosion, thereby improving reliability.

These and other objects, features, aspects and advantages of the present invention will become more apparent from the following detailed description of the present invention when taken in conjunction with ,the accompanying drawings.

BRIEF DESCRIPTION OF THE DRAWINGS

FIG. 1A is a plan view of the semiconductor device; and FIGS. 1B and 1C are a cross-sectional view of the semiconductor device;

FIG. 6A is a plan view of the semiconductor device; and FIG. 6B is a cross-sectional view of the semiconductor device.

DESCRIPTION OF THE PREFERRED EMBODIMENTS

First Preferred Embodiment

Figure 1A:
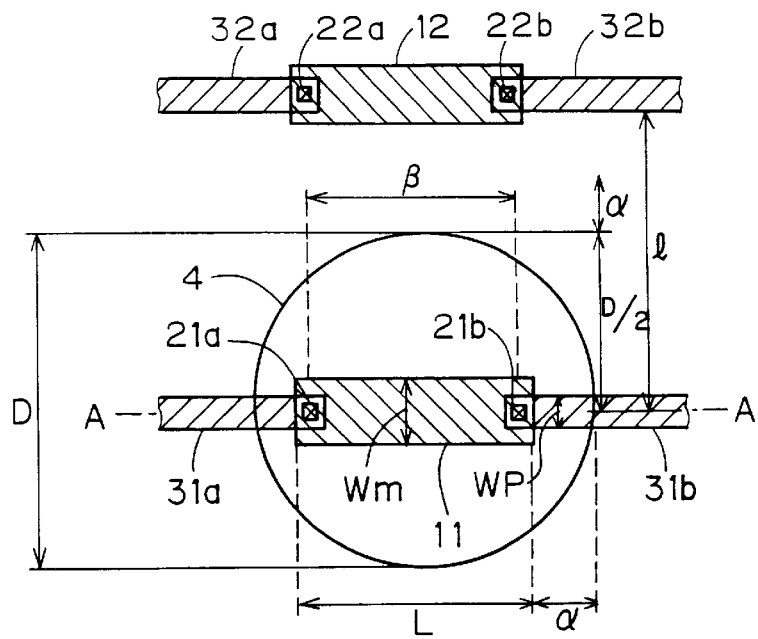
FIGS. 1A to 1C illustrate a semiconductor device according to a first preferred embodiment of the present invention.
Figure 1B:
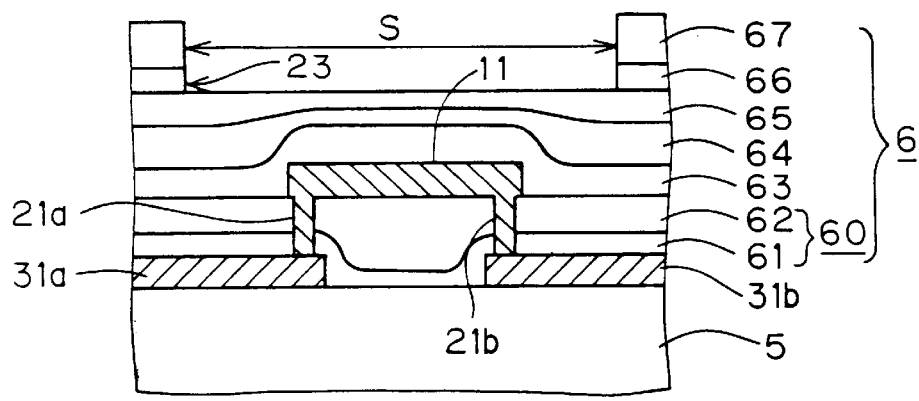

FIGS. 1A and 1B are a diagram for explaining a semiconductor device according to a first preferred embodiment of the present invention: FIG. 1A is a plan view of a detailed part of the semiconductor device; and FIG. 1B is a cross-sectional view along line A—A of FIG. 1A.

Figure 2A:
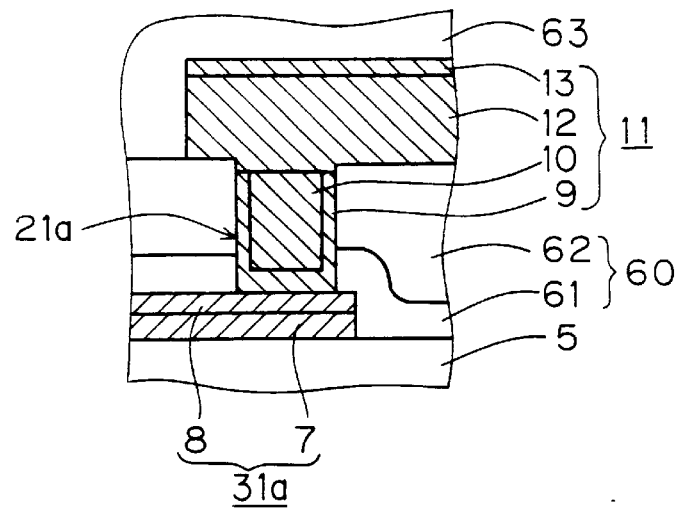
FIGS. 2A to 2C are an enlarged cross-sectional of the vicinity of a contact hole of FIG. 1B.
Figure 2B:
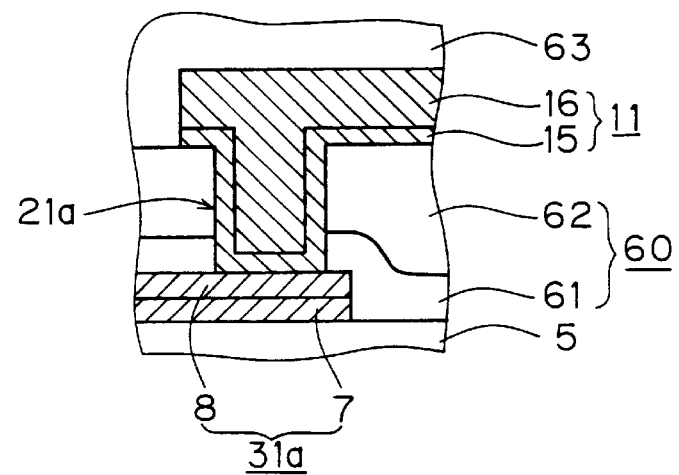
Figure 2C:
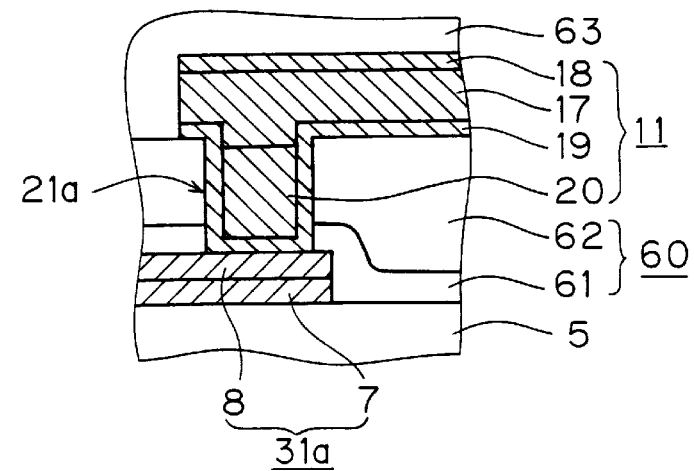

FIGS. 2A to 2C are an enlarged view of the portion in which a fuse member of FIG. 1B is in contact with a non-metallic conductive member. That is, these figures exemplify a structure of a fuse member and a non-metallic conductive member.

The first preferred embodiment demonstrates a semiconductor device having a stacked wiring layer structure comprising a single polysilicon wiring layer and two metal wiring layers overlying (i.e., away from the surface of a substrate) the polysilicon wiring layer. It is noted that the upper metal wiring layer (i.e., farther away from the surface of the substrate) is not located in the vicinity of fuse members 11, 12 and therefore not shown in FIGS. 1A and 1B. The polysilicon wiring layer is not limited to a single layer and it may be stacked into multi-layers, while the metal wiring layer is not limited to two layers and it may be a single layer. In these cases, the principles are the same.

Referring to FIGS. 1A and 1B, the fuse members 11, 12 having a length L and a width Wm are provided in a different position and both are comprised of the lower metal wiring layer (i.e., nearer to the surface of a substrate (hereinafter referred to as "first metal wiring layer"). The fuse members are, for example, composed of Cu or W that can be cut by laser light and, depending on the case, they form a stacked structure with Ti or TiN. Alternatively, they may be composed of AlCu or AlSiCu.

Non-metallic conductive members 31a, 31b are formed beneath the fuse member 11 and are electrically connected to the fuse member 11 through contact holes 21a, 21b, respectively. Similarly, non-metallic conductive members 32a, 32b are formed beneath the fuse member 12 and are electrically connected to the fuse member 12 through contact holes 22a, 22b, respectively. The non-metallic conductive members are, for example, comprised of the polysilicon wiring layer comprising a polysilicon to which impurity has been added. Alternatively, they may comprise stacked films of a non-crystal silicon film and a WSi film, instead of the polysilicon.

FIGS. 2A to 2C are a cross-sectional view illustrating an example of the construction of a fuse member 11 and non-metallic conductive member 31a. With respect to FIG. 2A, a non-metallic conductive member 31a comprises stacked films of a polycrystal or non-crystal silicon film 7 to which impurity has been added, and a WSi film 8 overlying the film 7. The fuse member 11 comprises: a stacked structure of a TiN/Ti film 9 and a W layer 10 that are filled in a contact hole 21a; and stacked films of an AlCu film 12 that is in contact with the top surface of the stacked structure and extends over an interlayer insulation film 60, and a TiN film 13 overlying the AlCu film 12.

As shown in FIG. 2B, a non-metallic conductive member 31a may comprise stacked films of a polycrystal or non-crystal silicon film 7 to which impurity has been added, and a WSi film 8 overlying the film 7. A fuse member 11 may comprise a stacked structure of a TiN/Ti film 15 and a W layer 16 that are filled in a contact hole 21a and extend over an interlayer insulation film 60.

As shown in FIG. 2C, a non-metallic conductive member 31a may comprise stacked films of a polycrystal or non-crystal silicon film 7 to which impurity has been added, and a WSi film 8 overlying the film 7. A fuse member 11 may comprises: (A) a TiN/Ti film 19 covering the sidewall of a contact hole 21a and extending over an interlayer insulation film 60; (B) a W layer 20 filled in the contact hole 21a whose sidewall is covered with the TiN/Ti film 19; and (C) stacked films of an AlCu film 17 that is in contact with the top surface of the W layer 20 and extends over the TiN/Ti film 19, and a TiN film 18 overlying the AlCu film 17.

The constructions shown in FIGS. 2A to 2C are of course applicable to the fuse member 11 and non-metallic conductive member 31b in the contact hole 21b, alternatively, to the fuse member 12 and the non-metallic conductive members 32a, 32b.

Referring again to FIG. 1A, laser light 4 for cutting the fuse members 11, 12 has an irradiation spot diameter D. In the first preferred embodiment only the case where the laser light 4 cuts the fuse member 11 is discussed for simplicity. In the case where the laser light 4 cuts the fuse member 12, the principles are the same.

The fuse member 11 is formed so that it has a length L equal to or smaller than the value obtained by subtracting an alignment error $\alpha$ of laser light 4 from its irradiation spot diameter D. That is, the condition $L \leq D-\alpha$ is satisfied. For instance, it is set that the laser spot diameter D is 5 $\mu$m, the laser alignment error $\alpha$ is ±0.5 $\mu$m, and the length L of the fuse member 11 is not more than 4 $\mu$m.

In order that the fuse member 11 is satisfactorily removed by the laser blow of the laser light 4 having an irradiation diameter D of 5 $\mu$m, the width Wm of the fuse member 11 is preferably set so as not to exceed 1.5 $\mu$m.

In addition, it is desirable that the adjacent fuse members 11, 12 are spaced apart by at least a distance obtained by adding the alignment error $\alpha$ to the half of a spot diameter D of laser light (i.e., $D/2+\alpha$). The reason for this is that when a fuse member adjacent to another fuse member subjected to laser blow should not receive the laser blow, the former must be prevented from being irradiated by the laser light 4. When the laser light spot diameter D is 5 $\mu$m and the laser alignment error $\alpha$ is ±0.5 $\mu$m, a distance l between the adjacent fuse members is set to be not less than 3 $\mu$m.

It is noted that part of the non-metallic conductive members 31a, 31b is eluted at the laser blow. In order to facilitate the elusion and avoid explosion due to the laser blow, the non-metallic conductive members 31a, 31b preferably have a smaller width Wp. An adequate value is 1.2 $\mu$m.

Even if the non-metallic conductive members 31a, 31b have a width Wp of 1.0 $\mu$m or less, when a space $\beta$ of the members 31a, 31b connected to ends of the fuse member 11, respectively, is smaller than 2 $\mu$m, the members 31a, 31b explode due to laser blow. As a result, the blow trace becomes larger to affect the adjacent fuse member 12. Therefore, the space $\beta$ should be not less than 2 $\mu$m.

Referring to FIG. 1B, a semiconductor substrate 5 underlies non-metallic conductive members 31a, 31b, 32a, 32b. A semiconductor device comprises a substrate body of silicon single crystal, semiconductor elements and interlayer insulation films which are all formed over the substrate body. The layer directly under the non-metallic conductive members 31a, 31b, 32a, 32b is preferably an interlayer insulation film of, such as a TEOS (Tetra-Ethyl Ortho-Silicate) or BPTEOS (Boro-Phospho-TEOS).

An interlayer insulation film 60 is disposed between the undermost wiring layer (the polysilicon layer) in which the non-metallic conductive members 31a, 31b, 32a, 32b are formed, and the first metal wiring layer in which the fuse members 11, 12 are formed. The interlayer insulation film 60 is for example comprised of stacked films of a TEOS film 61 and a BPTEOS or BPSG (Boro-Phospho-Silicate Glass) film 62. As an interlayer insulation film between the upper metal wiring layer (not shown, hereinafter referred to as "second metal wiring layer") and the first metal wiring layer in which the fuse members 11, 12 are formed, there are formed stacked films of a plasma oxide film 63, an SOG (Spin on Glass) film 64 and a plasma oxide film 65. In addition, a plasma nitride film 66 and a photosensitive polyimide layer 67 are formed over the second metal wiring layer (not shown).

An insulating film 6 comprises the interlayer insulation film 60, the plasma oxide film 63, the SOG film 64, the plasma oxide film 65, the plasma nitride film 66, and the polyimide layer 67.

Figure 1C:
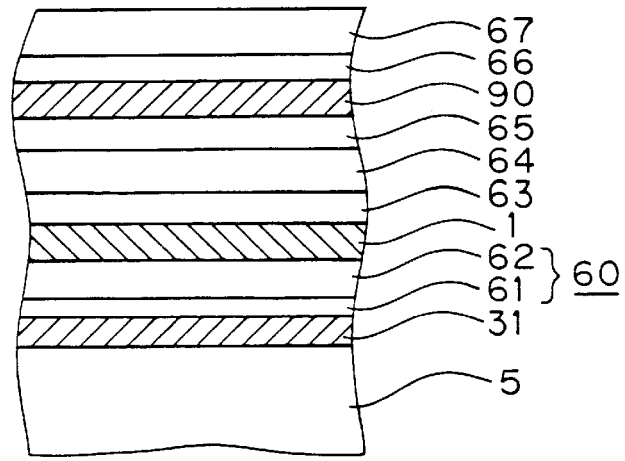

FIG. 1C is a cross-sectional view of a stacked structure in the region in which no fuse member 11 is present. A polysilicon wiring layer 31 which is formed in the same processing step as the non-metallic conductive members 31a, 31b, 32a, 32b: a TEOS film 61: a BPTEOS (or BPSG) film 62: a first metal wiring layer 1 which is formed in the same processing step as the fuse members 11, 12: a plasma oxide film 63: an SOG film 64: a plasma oxide film 65: a second metal wiring layer 90: a plasma nitride film 66: and a polyimide layer 67 are stacked upward in this order over the surface of a semiconductor substrate 5.

Over the fuse member 11, an opening 23 whose open diameter S is equal to or greater than the value obtained by adding an alignment error α of laser light 4 to its spot diameter D, is formed in the plasma nitride film 66 and the photosensitive polyimide layer 67. Similarly, an opening is formed over the fuse member 12. Thanks to the opening in the plasma nitride film 66 and the photosensitive polyimide layer 67, it is possible to reduce the total film thickness of the insulating films over the fuse members 11, 12 and permit a stable blow by the laser light 4. To avoid complexity, the opening 23 is omitted in FIG. 1A.

Figure 3:
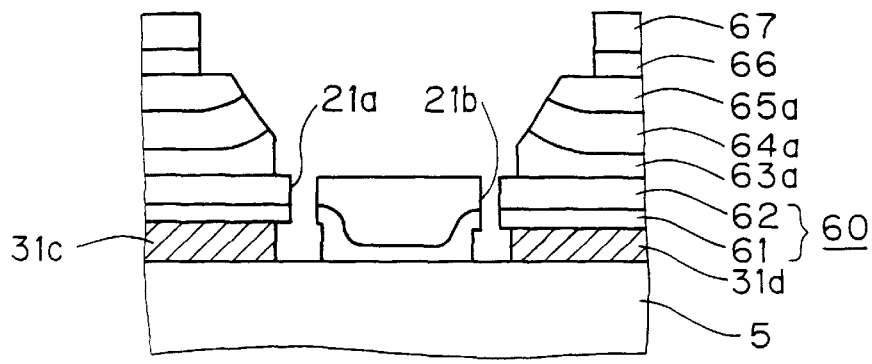
FIG. 3 is a cross-sectional view along line A—A of FIG. 1A immediately after laser blow.

FIG. 3 is a cross-sectional view along line A—A of FIG. 1A immediately after the laser blow under the favorable conditions as described earlier. Part of non-metallic conductive members 31a, 31b is eluted to have shapes as shown by reference numerals 31c and 31d, respectively. Further, the entire fuse member 11 is splashed, and the metal within contact holes 21a, 21b is completely removed. At the same time, part of interlayer insulation films 63, 64, 65 is splashed to have shapes as shown by reference numerals 63a, 64a and 65a, respectively.

Thereafter, in order to remove the splashed metal, an ultrasonic cleaning that can be omitted may be performed. Then, a post-test step and assembly steps comprising a dicing, a wire bonding and a resin molding are performed to produce a package in which a chip having the above-mentioned structure is placed.

In the first preferred embodiment, the fuse member 11 as well as the metal filled in the contact holes 21a, 21b are completely removed by laser blow. Additionally, the fuse members 11, 12 have a length L smaller than the value obtained by subtracting an alignment error a of the laser light 4 from its spot diameter D. Still further, a plurality of fuse members 11, 12 are spaced apart by a distance not less than the value obtained by adding an alignment error α to the half of the laser light spot diameter D. It is therefore possible to obtain semiconductor devices with a fuse that can be cut by a relatively small energy without adding further processing steps and also prevent metal from remaining and then causing corrosion, thereby further improving reliability.

Second Preferred Embodiment

The first preferred embodiment illustrates the case where the wiring layer structure comprises a single polysilicon wiring layer and two metal wiring layers. A second preferred embodiment differs from the first preferred embodiment in that a wiring layer structure comprises a single polysilicon wiring layer and three metal wiring layers. Other structural features are the same as that of the first preferred embodiment. Accordingly, the major positional relation shown in plan view is similar to that shown in FIG. 1A of the first preferred embodiment, and the same reference numeral indicates the same positional relation. The polysilicon wiring layer is not limited to a single layer and it may be multi-layers. The principles are the same in these cases, as in the first preferred embodiment.

Figure 4A:
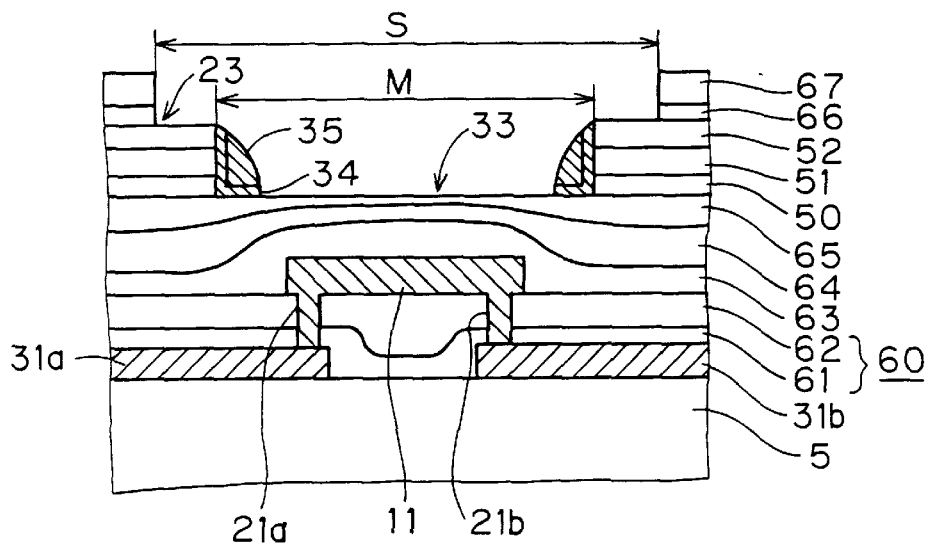
FIGS. 4A and 4B are a cross-sectional view of a semiconductor device of a second preferred embodiment of the present invention.

FIG. 4A is a cross-sectional view of a detailed part of a semiconductor device according to the second preferred embodiment. A second metal wiring layer that is the next undermost wiring layer is not located in the vicinity of fuse members 11, 12 similar to the first preferred embodiment and therefore not shown in FIG. 4A. Also, the uppermost metal wiring layer (hereinafter referred to as "third metal layer") is not shown.

Figure 4B:
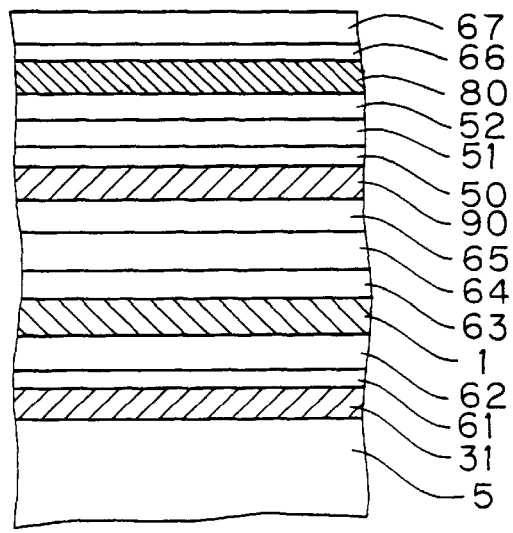

FIG. 4B is a cross-sectional view of a stacked structure in the region in which fuse members 11, 12 are not present in a semiconductor device of the second preferred embodiment. A polysilicon wiring layer 31 which is formed in the same processing step as non-metallic conductive members 31a, 31b, 32a, 32b: a TEOS film 61: a BPTEOS (or BPSG) film 62: a first metal wiring layer 1 which is formed in the same processing step as the fuse members 11, 12: a plasma oxide film 63: an SOG film 64: a plasma oxide film 65: a second metal wiring layer 90: a plasma oxide film 50: an SOG film 51: a plasma oxide film 52: a third metal wiring layer 80: a plasma nitride film 66: and a polyimide layer 67 are stacked upward in this order over the surface of a semiconductor substrate 5.

As can be seen from FIG. 4B, in the second preferred embodiment the fuse member 11 is formed by the first metal wiring layer 1 that is third metal wiring from the top metal wiring layer.

The characteristic features of the second preferred embodiment are described hereafter. Interlayer insulation films 50 to 52 between the second wiring layer 90 and the third metal wiring layer 80 are subjected to an etching for opening a through hole that electrically connects the second and third metal wiring layers. If the through hole for electrical connection between the first metal wiring layer 1 and the second metal wiring layer 90 is referred to as a first through hole, the step for opening the interlayer insulation films 50 to 52 is that for forming a second through hole.

In the wiring layers of the second preferred embodiment (which comprises at least a single polysilicon layer and the overlying first to third metal wiring layers), laser blow is conducted under the same conditions as in the first preferred embodiment. Therefore, in the step of forming the second through hole, part of the interlayer insulation films 50 to 52, which part is located above the fuse member 11, is also removed by etching at the same time, so that an opening 33 is formed over the fuse member 11. Similarly, the interlayer insulation films 50 to 52 located above a fuse member 12 are also opened.

As a result, the insulating film overlying the fuse members 11, 12 has a thickness equal to that of the first preferred embodiment, permitting a stable laser blow. As described earlier, the interlayer insulation films 50, 51 and 52 may be comprised of a plasma oxide film, an SOG film and a plasma oxide film, respectively, as in the interlayer insulation film 63, 64 and 65.

It should be noted that in forming the third metal wiring layer, metal to be filled in the second through hole, e.g., a TiN/Ti 34 and W 35, might remain secondarily on the sidewall of the opening 33, as shown in FIG. 4A. When the fuse member 11 is blown by laser light 4, the remaining metals 34, 35 might be non-uniformly splashed and then adhere to other portions so as to cover them. To avoid this, the sidewall must be well away from the center of the fuse member 11. Therefore, the open diameter M of the opening 33 should preferably be equal or in excess of two times the laser spot diameter D, that is, be equal or in excess of two times of the value obtained by adding an alignment error a to the length L of the fuse member.

The problem that unnecessary metal remains in openings as stated above can also occur in the step of forming the first through hole that connects the first metal wiring layer 1 and the second metal wiring layer 90 in the first preferred embodiment. Thus, in the first preferred embodiment as well as the second preferred embodiment, it is preferable to make the open diameter of the opening 23 should preferably be equal or in excess of two times the laser spot diameter D.

Further, the diameter S of the opening 23 in the second preferred embodiment should preferably be equal or in excess of two times a diameter M in order to expose the opening 33.

The major construction of the second preferred embodiment is common to that of the first preferred embodiment, resulting in the same effect. In addition, the second preferred embodiment can solve the problem peculiar to the wiring layer structure comprising three metal wiring layers.

Third Preferred Embodiment

The second preferred embodiment illustrates the construction in which the wiring layer structure comprises a single polysilicon wiring layer and three metal wiring layers and the fuse members 11, 12 are formed by the first metal wiring layer that is the undermost metal wiring layer of the three metal wiring layers. A third preferred embodiment has the same wiring layer structure as the second preferred embodiment but differs in that fuse members 11, 12 are formed by a second metal wiring layer. Other characteristic features are the same as the second preferred embodiment. Accordingly, the major positional relation shown in plan view is similar to that shown in FIG. 1A of the first preferred embodiment, and the same reference numeral indicates the same positional relation. The polysilicon wiring layer is not limited to a single layer and it may be in multi-layers. The principles are the same.

Figure 5:
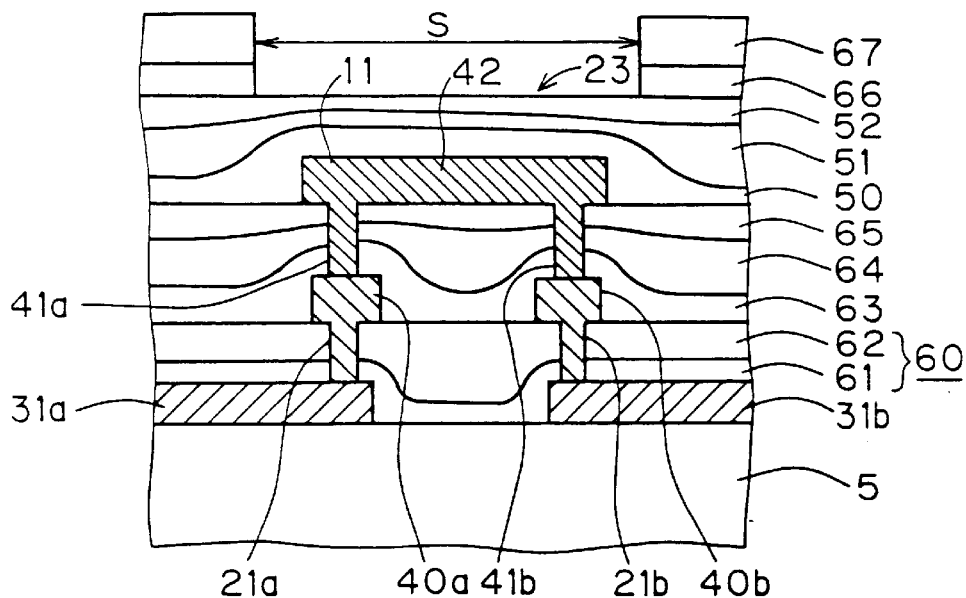
FIG. 5 is a cross-sectional view of a semiconductor device of a third preferred embodiment of the present invention.
Figure 6A:
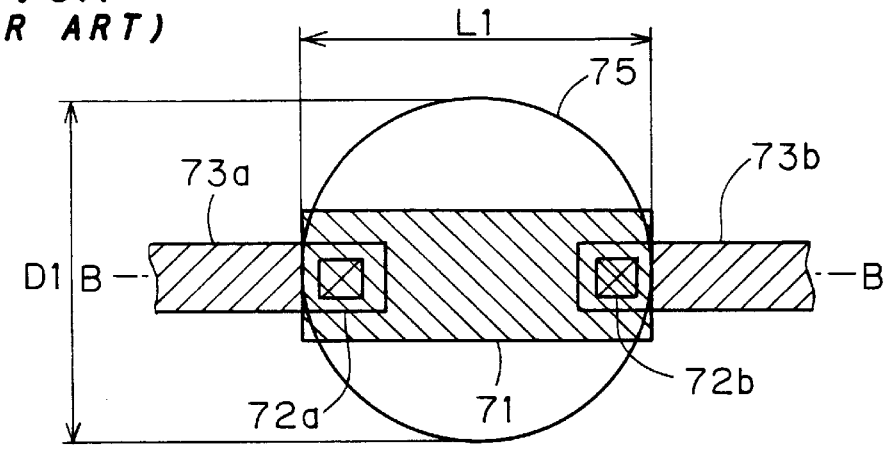
FIGS. 6A and 6B illustrate a conventional semiconductor device.
Figure 6B:
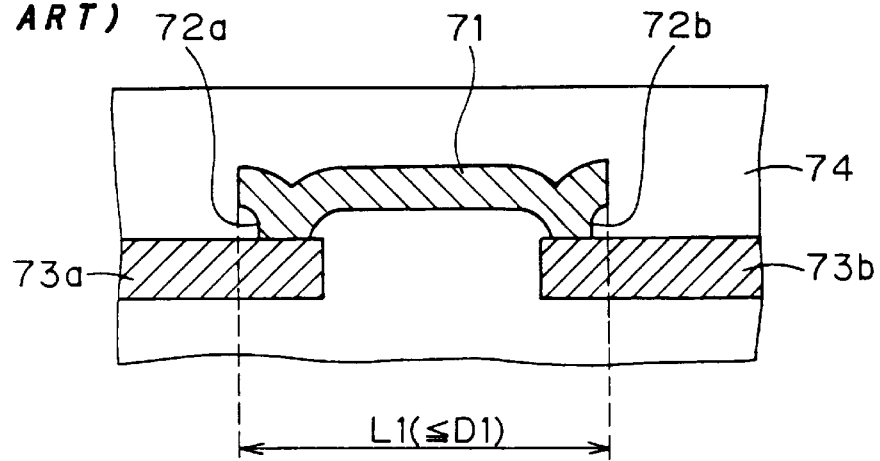

FIG. 5 is a cross-sectional view of a detailed part of a semiconductor device according to the third preferred embodiment. Similarly to the second preferred embodiment, a third metal wiring layer 80 as the uppermost layer is not located in the vicinity of fuse members 11, 12 and therefore not shown in FIG. 5. The stacked structure in the region in which the fuse members 11, 12 are not present is as shown in FIG. 4B.

Referring to FIG. 5, the characteristic features of the third preferred embodiment are described hereunder. Since laser blow is performed under the same conditions as in the second preferred embodiment, a fuse member 11 is formed by a second metal wiring layer 42. As shown in FIG. 5, the stacked-via type structure is employed for example. Specifically, conductors 40a, 40b to be formed by a first metal wiring layer 1 that is the undermost wiring layer are disposed directly above contact holes 21a, 21b, and contact holes 41a, 41b are opened in interlayer insulation films 63, 64, 65. A non-metallic conductive member 31a is electrically connected to one end of the fuse member 11 through the contact holes 21a, 41a, while a non-metallic conductive member 31b is electrically connected to the other end of the fuse member 11 through the contact holes 21b, 41b. The same construction can be employed for the fuse member 12.

It should be mentioned that although FIG. 5 demonstrates the stacked-via type structure, the semiconductor device of the present invention is not limited to this type alone and it may be any structure in which the second metal wiring layer serving as the fuse member 11 is connected, through the first metal wiring layer 1, to the non-metallic conductive members 31a, 31b formed by a polysilicon wiring layer 31.

In this manner, the insulating films overlying the fuse members 11, 12 have a total thickness similar to that of the second preferred embodiment, permitting a stable laser blow.

The major construction of the third preferred embodiment is common to that of the first preferred embodiment, resulting in the same effect. In addition, due to the absence of an opening 33, the third preferred embodiment is free from the problem that metals 34, 35 remain on the sidewall of the opening 33 as in the second preferred embodiment. Thus, the third preferred embodiment characterized in that a fuse member is formed by the next uppermost metal wiring layer, can extend to metal wiring layer structures comprising four or more metal wiring layers.

While the invention has been shown and described in detail, the foregoing description is in all aspects illustrative and not restrictive. It is therefore understood that numerous modifications and variations can be devised without departing from the scope of the invention.

We claim:

1. A semiconductor device comprising:

a semiconductor substrate;

a pair of non-metallic conductive members disposed on said semiconducting substrate;

first to Nth ($N \geq 2$) metal wiring layers stacked through interlayer insulating film upward in sequence over said semiconductor substrate and said pair of non-metallic conductive members;

at least one fuse member formed by said (N−1)th metal wiring layer, said at least one fuse member having ends electrically connected to said pair of non-metallic conductive members through contact holes, said at least one fuse member having a total length L and being cuttable by a laser light having a spot diameter D and an alignment error $\alpha$; and an insulating layer disposed over said Nth metal wiring layer, said insulating layer including an opening having a diameter S directly above said fuse member, wherein $L \leq D - \alpha$, and $S \geq L$.

2. The semiconductor device of claim 1, wherein $S > 2L$.

3. The semiconductor device of claim 1, wherein N is 2.

4. The semiconductor device of claim 1, wherein $N \geq 3$.

5. The semiconductor device of claim 4, wherein said (N−1)th metal wiring layer form a stacked-via type structure with an (N−2)th metal wiring layer.

6. The semiconductor device of claim 1, wherein said at least one fuse member comprises a first fuse member and a second fuse member adjacent to said first fuse member, said first and second fuse members being spaced apart by a distance l, wherein $(D/2) + \alpha \leq l$.

7. A semiconductor device comprising:

a semiconductor substrate;

a pair of non-metallic conductive members disposed on said semiconducting substrate;

first to Nth ($N \geq 3$) metal wiring layers stacked through interlayer insulation films upward in sequence over said semiconductor substrate, said first to Nth metal wiring layers being disposed over said pair of non-metallic conductive members;

a fuse member formed by an (N−2)th metal wiring layer, said fuse member having ends electrically connected to said pair of non-metallic conductive members through contact holes, said fuse member having a total length L and being cuttable by a laser light having a spot diameter D and an alignment error $\alpha$; and an opening having a diameter M provided in one of said interlayer insulation films between said Nth metal wiring layer and said (N−1)th metal wiring layer, directly above said fuse member, wherein $L \leq D - \alpha$, and $M \geq 2L$.

8. The semiconductor device of claim 7, further comprising an insulating layer disposed over said Nth metal wiring layer and including an opening having a diameter S directly above said fuse member, wherein $S > M$.

* * * * *